(12) United States Patent
Ummy (10) Patent No.: US 10,218,143 B2
(45) Date of Patent: Feb. 26, 2019

(54) DUAL OUTPUT SEMICONDUCTOR OPTICAL AMPLIFIER-BASED TUNABLE FIBER LASER

(71) Applicant: Research Foundation of the City University of New York, New York, NY (US)

(72) Inventor: Muhammad Ali Ummy, New Hyde Park, NY (US)

(73) Assignee: Research Foundation of the City University of New York, New York, NY (US)

(*) Notice: Subject to any disclaimer, the term of this patent is extended or adjusted under 35 U.S.C. 154(b) by 0 days.

(21) Appl. No.: 15/903,555

(22) Filed: Feb. 23, 2018

(65) Prior Publication Data
US 2018/0248334 A1    Aug. 30, 2018

Related U.S. Application Data

(60) Provisional application No. 62/463,241, filed on Feb. 24, 2017.

(51) Int. Cl.
| | |
|---|---|
| H01S 3/30 | (2006.01) |
| H01S 3/067 | (2006.01) |
| H01S 3/137 | (2006.01) |
| H01S 3/08 | (2006.01) |
| H01S 3/10 | (2006.01) |

(52) U.S. Cl.
CPC ...... *H01S 3/06791* (2013.01); *H01S 3/06754* (2013.01); *H01S 3/06758* (2013.01); *H01S 3/06787* (2013.01); *H01S 3/08036* (2013.01); *H01S 3/08059* (2013.01); *H01S 3/1003* (2013.01); *H01S 3/10007* (2013.01); *H01S 3/10061* (2013.01); *H01S 3/137* (2013.01);
(Continued)

(58) Field of Classification Search
CPC ............ H01S 3/06758; H01S 3/06791; H01S 3/08059; H01S 3/10061; H01S 3/06754; H01S 3/06766; H01S 3/06787; H01S 3/1003; H01S 3/10007; H01S 3/08036; H01S 3/08031
See application file for complete search history.

(56) References Cited

U.S. PATENT DOCUMENTS

| | | | | |
|---|---|---|---|---|
| 5,050,183 A | * | 9/1991 | Duling, III .......... | H01S 3/06791 372/106 |
| 6,501,591 B1 | * | 12/2002 | Kumar .................... | G02F 1/395 359/326 |

(Continued)

OTHER PUBLICATIONS

Ummy, M. et al.; Beam Combining of SOA-Based Bidirectional Tunable Fiber Nested Ring Lasers With Continuous Tunability Over the C-band at Room Temperature; Journal of Lightwave Technology; Aug. 15, 2016; pp. 3703-3710; vol. 34, No. 16; IEEE.

(Continued)

*Primary Examiner* — Kinam Park
(74) *Attorney, Agent, or Firm* — Peter J. Mikesell; Schmeiser Olsen & Watts, LLP (57) ABSTRACT

A dual output semiconductor optical amplifier-based tunable fiber laser is provided that can be switched from low to high power and vice versa. The laser system uses bidirectional semiconductor optical amplifier (SOA) for amplification and hence is able to introduce a unique feature of adjustable dual/single output ports.

11 Claims, 9 Drawing Sheets

(52) U.S. Cl.
CPC ....... *H01S 3/06766* (2013.01); *H01S 3/08031* (2013.01)

(56) References Cited

U.S. PATENT DOCUMENTS

| | | | |
|---|---|---|---|
| 6,570,893 B1* | 5/2003 | Libatique | H01S 3/0675 372/20 |
| 9,019,998 B1* | 4/2015 | Qureshi | H01S 5/142 372/20 |
| 2016/0352060 A1* | 12/2016 | Long | G02B 26/007 |

OTHER PUBLICATIONS

Ummy, M. et al.; Tunable multi-wavelength SOA based linear cavity dual-output port fiber laser using Lyot-Sagnac loop mirror; Opt. exp.; Feb. 3, 2011; pp. 3202-3211; vol. 19, No. 4; Optics Express.

Sivaramakrishnan, S. et al.; Dynamics of Passively Phased Ring Oscillator Fiber Laser Arrays; IEEE Journal of Quantum Electronics; Jun. 25, 2015; pp. 1-9; vol. 51, No. 8; IEEE.

Bochove, E. et al.; Analysis of a Spatial-Filtering Passive Fiber Laser Beam Combining System; IEEE Journal of Selected Topics in Quantum Electronics, Feb. 10, 2009; pp. 320-327; vol. 15, No. 2; IEEE.

Jeux, F. et al.; Efficient passive phasing of an array of 20 ring fiber lasers; Laser Physics Letters; Jul. 29, 2014; pp. 1-5; Lett. 11; Astro Ltd.

Zhang, J. et al.; Stable Single-Mode Compound-Ring Erbium-Doped Fiber Laser; Journal of Lightwave Technology; Jan. 1996; pp. 104-109; vol. 14, Issue: 1; IEEE.

Chen, X. et al.;Ultranarrow dual-transmission-band fiber Bragg grating filter and its application in a dual-wavelength single-longitudinal-mode fiber ring laser; Optics Letters; Aug. 15, 2005; pp. 2068-2070; vol. 30, No. 16; Optical Society of America.

Zhang, J. et al.; Compound fiber ring resonator: theory; J. Opt. Soc. Am. A; Jun. 1994; pp. 1867-1873; vol. 11, No. 6; Optical Society of America.

Zhang, J. et al.; All-Fiber Compound Ring Resonator with a Ring Filter; Journal of Lightwave Technology; Jul. 1994; pp. 1256-1262; vol. 12, No. 7; IEEE.

Syms, R R A. et al.; Sliding-blade MEMS iris and variable optical attenuator; J. Micromech. Microeng.; Sep. 14, 2004; pp. 1700-1710; vol. 14; Institute of Physics Publishing.

Unamuno, A. et al.; MEMS Variable Optical Attenuator With Vernier Latching Mechanism; IEEE Photonics Technology Letters; Jan. 1, 2006; pp. 88-90; vol. 18, No. 1; IEEE.

Marxer, C. et al.; A Variable Optical Attenuator Based on Silicon Micromechanics; IEEE Photonics Technology Letters; Feb. 1999; pp. 233-235; vol. 11, No. 2; IEEE.

Sun, G. et al.; Simultaneous Temperature and Strain Measurement Using Two Types of High-Birefringence Fibers in Sagnac Loop Mirror; IEEE Photonics Technology Letters; Dec. 15, 2007; pp. 2027-2029; vol. 19, No. 24; IEEE.

Loftus, T. et al.; 522 W average power, spectrally beam-combined fiber laser with near-diffraction-limited beam quality; Optics Letters; Nov. 26, 2007; pp. 349-351; vol. 32, No. 4; Optical Society of America.

Sprangle, P. et al.; Incoherent Combining and Atmospheric Propagation of High-Power Fiber Lasers for Directed-Energy Applications; IEEE Journal of Quantum Electronics; Dec. 5, 2008; pp. 138-148; vol. 45, No. 2; IEEE.

Bloom, G. et al.; Coherent combining of two quantum-cascade lasers in a Michelson cavity; Optics Letters; May 28, 2010; pp. 1917-1919; vol. 35, No. 11; Optical Society of America.

Kozlov, V.A.. et al.; All-fiber coherent beam combining of fiber lasers; Optics Letters; Dec. 15, 1999; pp. 1814-1816; vol. 24, No. 24; Optical Society of America.

Moon, D. et al.; Tunable multi-wavelength SOA fiber laser based on a Sagnac loop mirror using an elliptical core side-hole fiber;Optics Express; Jun. 19, 2007; pp. 8371-8376; vol. 15, No. 13; OSA.

Kim, C. et al.; Tunable multi-wavelength all-fiber Raman source using fiber Sagnac loop filter; Optics Communications; Apr. 2003; pp. 291-295; vol. 218, Issues 4-6; Elsevier.

Klingebiel, S. et al.; Spectral beam combining of Yb-doped fiber lasers with high efficiency; J. Opt. Soc. Am.; Jul. 19, 2007; pp. 1716-1720; vol. 24, No. 8; Optical Society of America.

* cited by examiner

FIG. 9

DUAL OUTPUT SEMICONDUCTOR OPTICAL AMPLIFIER-BASED TUNABLE FIBER LASER

CROSS-REFERENCE TO RELATED APPLICATIONS

This application claims priority to and is a non-provisional of U.S. Patent Application No. 62/463,241 (filed Feb. 24, 2017), the entirety of which is incorporated herein by reference.

BACKGROUND OF THE INVENTION

No other scientific invention of the 20th century has been demonstrated with so many exciting applications as laser (Light Amplification by Stimulated Emission of Radiation). There are numerous applications for both low and high power laser sources. A low power laser source can be used in the field of optical communications, fiber sensors, radio frequency (RF) photonics while the high-power laser source is used for industrial use such as welding, cutting and drilling. There is also a great need for high power laser in the defense industries. Military departments use lasers in the field of target designation and ranging, defensive countermeasures and directed energy weapons.

The current fiber-based laser systems for CW (continuous wavelength) are not user friendly. They are bulky, inefficient, and very expensive ($50K-$150K). The existing technology uses a long erbium doped fiber amplifier (EDFA) as a gain media. The disadvantage of this system include: (1) requiring extra optical pump (laser) (2) limited output power (3) requiring very expensive high optical power components such as isolators and circulators which in turn drives the price of the laser source higher (4) very complicated way of wavelength selection (5) two separate laser systems needed for low power and high power operations. An improved laser system is therefore desirable.

The discussion above is merely provided for general background information and is not intended to be used as an aid in determining the scope of the claimed subject matter.

BRIEF DESCRIPTION OF THE INVENTION

In a first embodiment, a fiber laser module is provided. The fiber laser module comprises a nested-ring resonator that is configured to selectively actuate (1) a first fiber optic branch, (2) a second fiber optic branch or (3) a common fiber optic branch using a first coupler ($C_1$) and a second coupler ($C_2$), wherein the first fiber optic branch comprises a first semiconductor optical amplifier ($SOA_1$), a tunable optical filter (TF) and a first polarization controller ($PC_1$); the second fiber optic branch comprises a second semiconductor optical amplifier ($SOA_2$) and a second polarization controller ($PC_2$); the third fiber optic branch comprises a third semiconductor optical amplifier ($SOA_3$) and a third polarization controller ($PC_3$); a first Sagnac loop mirror ($SLM_1$) directly connected to the first coupler ($C_1$), the $SLM_1$ comprising a fourth polarization controller ($PC_4$), a third coupler ($C_3$) and a first output ($OUT_1$); and a second Sagnac loop mirror ($SLM_2$) directly connected to the second coupler ($C_2$), the $SLM_2$ comprising a fifth polarization controller ($PC_5$) a fourth coupler ($C_4$) and a second output ($OUT_2$).

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
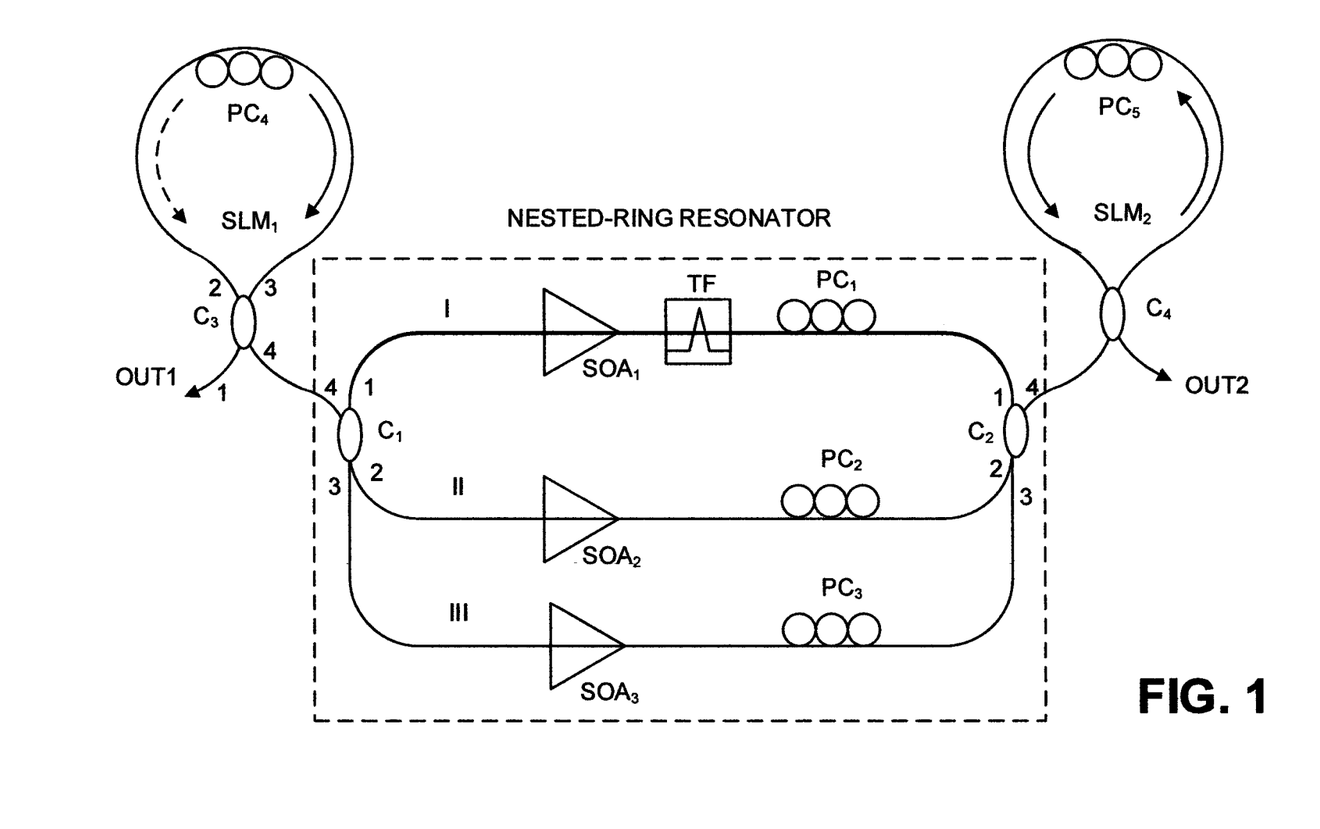
FIG. 1 is a schematic diagram that shows the structure of a dual-output port SOA-based tunable fiber laser with variable external reflectors (Sagnac loop mirrors) and three SOAs gain media placed in two bidirectional nested-ring cavities wherein only the counter-clockwise propagation in the nested-ring cavity is shown.

Disclosed in this specification is a dual output semiconductor optical amplifier-based tunable fiber laser that can be switched from low to high power and vice versa. The disclosed source is able to eliminate at least some of the drawbacks that exist with current systems. The disclosed laser system uses bidirectional semiconductor optical amplifier (SOA) for amplification and hence is able to introduce a unique feature of adjustable dual/single output ports as shown in FIG. 1. This feature gives the user an option to use the system either as a single source or as a dual source.

A simple, stable and inexpensive dual-output port widely tunable semiconductor optical amplifier (SOA)-based fiber compound-ring laser structure is disclosed. This unique nested ring cavity enables high optical power to split into different branches where amplification and wavelength selection are achieved by using low-power SOAs and a tunable filter. The phrase "low power" indicates components used for telecommunication systems, which usually can withstand/output less than or equal to 10 mW of power. Furthermore, two Sagnac loop mirrors, which are spliced at the two ends of the compound-ring cavity not only serve as variable reflectors but also channel the optical energy back to the same port without using any high optical power combiner. The expensive high power combiner with a multimode-fiber output port found in prior systems has been eliminated. The disclosed SOA-based fiber nested ring laser structure is a dual-output port all-single-mode-fiber laser structure that can be used in single or dual-output operation with adjustable output power. In addition, an SOA-based linear cavity dual-output port fiber laser using Lyot-Sagnac loop mirror was also developed to show the capability of having dual-output port by using broadband Sagnac loop mirrors in a linear cavity with just one SOA. However, by using the disclosed system of a nested ring cavity configuration, multiple low power SOAs can be stack in the laser cavity and coherently combine them. Thus, one can achieve a high power laser source by using low power optical components. Theoretical studies have also been done for passive coherent beam combining where the presented system uses 1×N fiber couplers and high power and complex micro-lens system for passively phased ring oscillator. The actual laser cavity is a linear configuration except the feedback branch included in order to control and synch the phases of oscillating modes in the linear cavity. This disclosure provides new capabilities of achieving highly power-scalable, stable, simple, compact and inexpensive high power laser systems using all-single mode fiber based nested ring cavities with C-band SOAs.

FIG. 1 illustrates the structure of the C-band SOA-based tunable fiber laser with two nested ring cavities and two broad band SLMs that serve as either dual output ports or a single output port according to the reflectivity settings of each of the SLMs. Each ring cavity consists of two branches I-II, I-III, for the inner and outer ring cavity, respectively. The branches are formed of fiber optic cable. Both ring cavities share a common branch, I, which contains an $SOA_1$, a tunable optical filter (TF), and a polarization controller, $PC_1$. Branch II contains an $SOA_2$ and a polarization controller, $PC_2$. Branch III also contains an $SOA_3$ and a polarization controller, $PC_3$. All the three branches, I, II and III, are connected by two 3 dB fiber couplers, $C_1$ and $C_2$. Each 3 dB fiber coupler, $C_1$ and $C_2$, is also connected to a Sagnac loop mirror, $SLM_1$ and $SLM_2$, respectively, as shown in FIG. 1. These Sagnac loop mirrors with a polarization controller placed in each loop act as variable reflectors. By adjusting the polarization controller (i.e., $PC_4$ or $PC_5$), one can change the reflectivity of the loop mirrors and thereby, can switch from single to dual-output port configuration. The low power tunable optical filter (TF), which is placed in the common branch I, is used for selecting and tuning the operating wavelength of the disclosed fiber laser.

Principle of operation: When the pump level (i.e., bias current threshold level) of either SOA is more than the total fiber compound-ring cavity losses, amplified spontaneous emission (ASE) emitted from SOAs propagates in the forward and backward directions. For instance, when a bias current ($I_B$) of around 75 mA is injected into the $SOA_1$ (branch I), the emitted ASE emitted by the $SOA_1$ (branch I) circulates in clockwise (cw) direction by propagating through a tunable optical filter, which selects a passband of certain wavelengths. The selected wavelengths reach a 3 dB fiber coupler $C_2$ after propagating through a polarization controller, $PC_1$. Then, the selected light beam that arrives at port 1 of the 3 dB fiber coupler $C_2$, is equally split into two branches, II and III at port 2 and port 3, respectively. The light beam that circulates into branch II propagates through a polarization controller, $PC_2$, before it is amplified by $SOA_2$ when its bias current level $I_B$ is above its current threshold level. Then, the amplified light beam arrives at port 2 of the 3 dB fiber coupler $C_1$ where it is equally divided between port 1 and port 4. Similarly, light beam from Branch III reaches port 3 after passing through a polarization controller, $PC_3$, amplified by $SOA_3$. Half of the light beam coupled into port 1 of the 3 dB fiber coupler $C_1$ is further amplified by $SOA_1$. Thus, a round-trip is completed in the fiber compound-ring structure and allows lasing to occur. Furthermore, the remaining 50% of the light beam is coupled into the output port 4 of the 3 dB fiber coupler $C_1$ is injected into the input port 4 (i.e., $I_{in}$) of the Sagnac loop mirror, $SLM_1$, which includes ports 1, 2, 3 and 4. The polarization controller, $PC_4$, controls the reflectivity of the $SLM_1$ and it is achieved by adjusting the state of polarization of the light beams propagating through the loop mirror. For a single output port configuration, the polarization controller $PC_4$ of $SLM_1$ is adjusted for minimum power at the output port 1 (OUT1). The counter-clockwise and clockwise light beams interfere destructively at the output port 1 while interfere constructively at the port 4 of the 3 dB fiber coupler, $C_3$, and thus it channels all the power back to the compound-ring cavity.

As there is no optical isolator placed in any of the three branches of the fiber compound-ring resonator, the two counter-propagating light beams circulate in the nested ring cavities. The counter-clockwise (ccw) propagating beam from the $SOA_1$ reaches the port 1 of the 3 dB coupler $C_1$, splits into two equal light beams (i.e., 50%) and is transmitted into ports 2 and 3. The light beam that propagates into branch II undergoes amplification by $SOA_2$. The amplified light beam that takes the path of branch II passes through a polarization controller $PC_2$ before it reaches port 2 of the 3 dB fiber coupler $C_2$, while the light beam that propagates through the branch III passes through the polarization controller $PC_3$ before it reaches port 3 of the 3 dB fiber coupler $C_2$. Half of the light beam at the 3 dB fiber coupler $C_2$ is coupled into port 1 where it propagates back into branch I to complete one round trip, while the other half of the beam is channeled into $SLM_2$. Similarly, the light beam that is fed into the $SLM_2$ exits at the output port 1 of the 3 dB fiber coupler $C_4$ (OUT2). The polarization controller, $PC_5$, controls the output power. An optical spectrum analyzer (OSA), variable optical attenuator (VOA) and optical power meter (PM) were used to characterize the disclosed fiber compound-ring laser. The path lengths of both loop II and loop III are the same since all branches have identical length and all fiber connections are done by using FC/APC connectors.

(N>>1) SOAs Based Bidirectional Fiber Nested Ring Laser Structure

Figure 2:
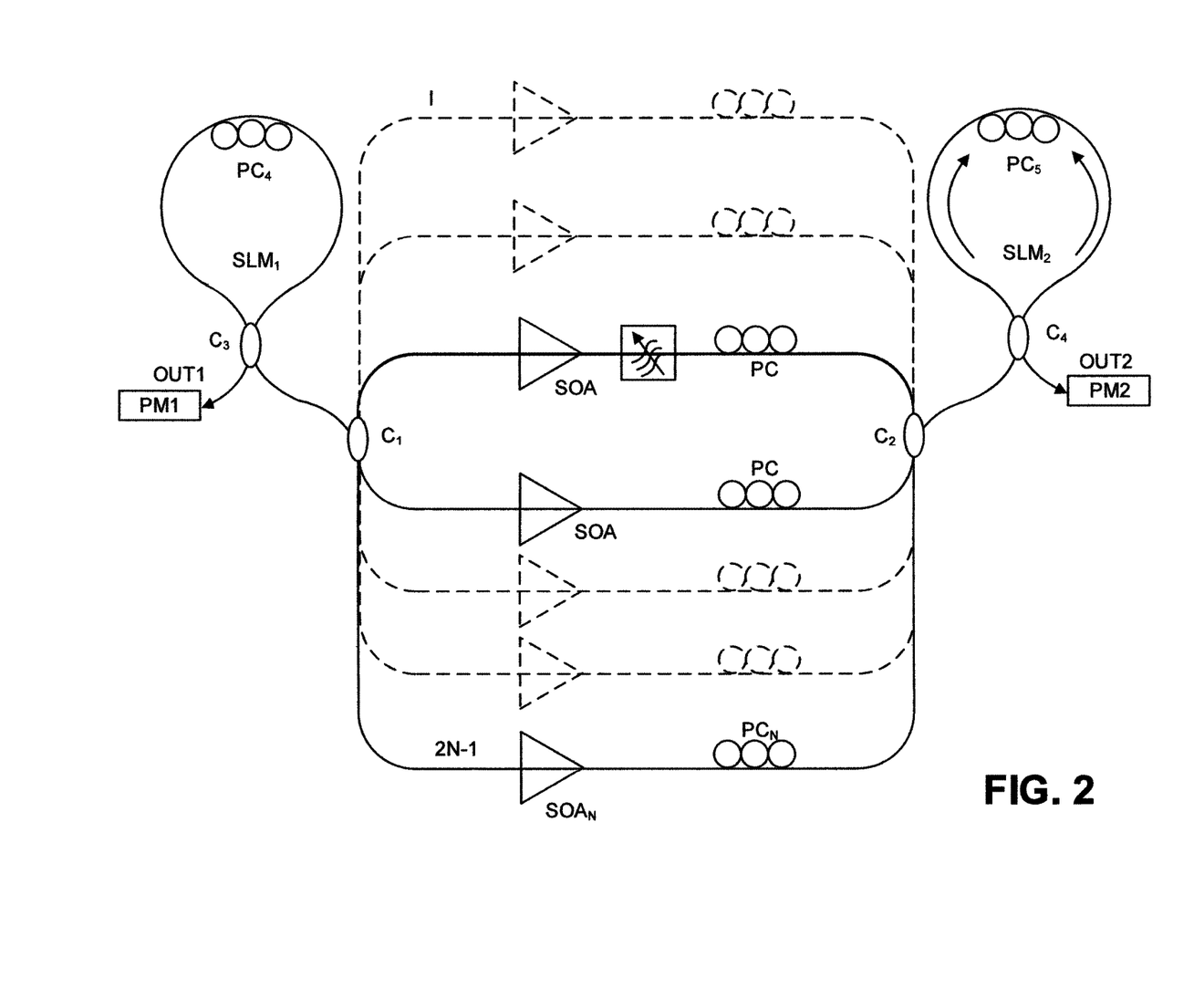
FIG. 2 is a schematic diagram of a SOAs based bidirectional tunable fiber ring laser structure with N-modules (N>>1)

FIG. 2. illustrates one embodiment of a fiber nested ring laser structure with N×N fiber couplers and two Sagnac loop mirrors, $SLM_1$ and $SLM_2$, which form the output couplers, OUT1 and OUT1. Based on the disclosed nested ring structure, it is possible to conceive of a high power fiber nested ring structure of low power (N>>1) SOA-based bidirectional fiber laser that uses two single unified N×N fiber couplers, $C_1$ and $C_2$, to form N/2 number merged fiber ring lasers with dual-output port formed by two variable external reflectors (SLMs), as illustrated in FIG. 2. Each branch of the fiber ring cavity contains an SOA and a polarization controller. An optical filter can be placed in either one of the branches between an SOA and a polarization controller. This can form a unit or a module.

Figure 3:
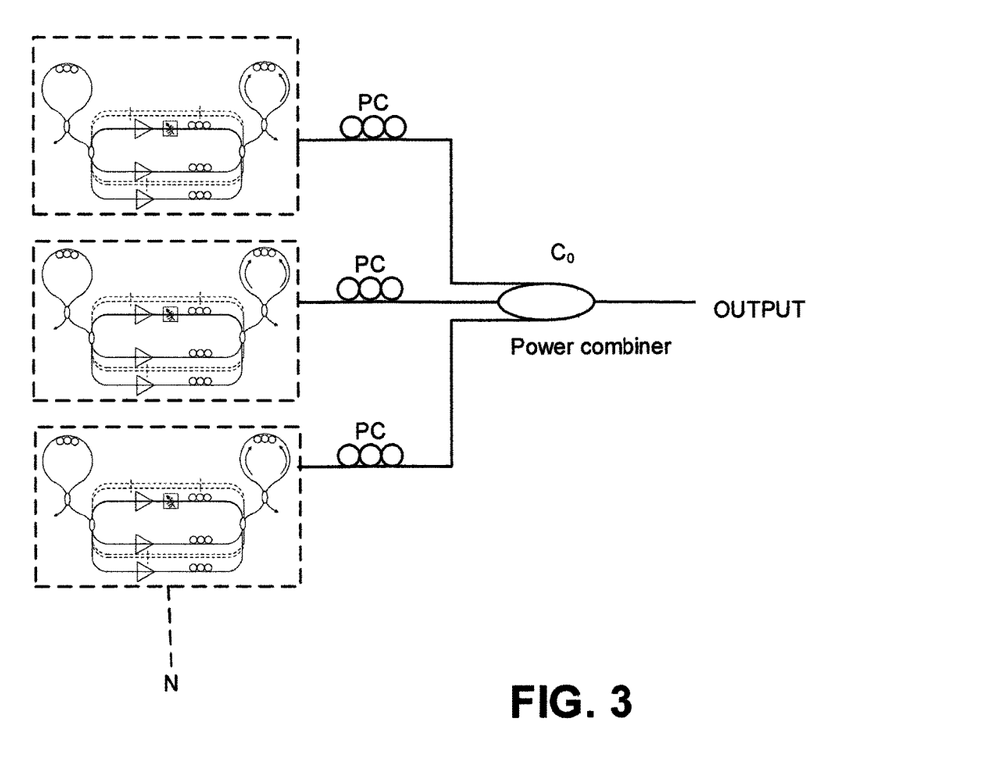
FIG. 3 is another schematic diagram of a SOAs based bidirectional tunable fiber ring laser structure with N-modules (N>>1)

Due to the limitation of making N×N fiber coupler, we disclosed another structure, as shown in FIG. 3, The output of each unit/module as described are then combined by the help of power combiner $C_0$ (see FIG. 3) to generate more power.

Figure 4:
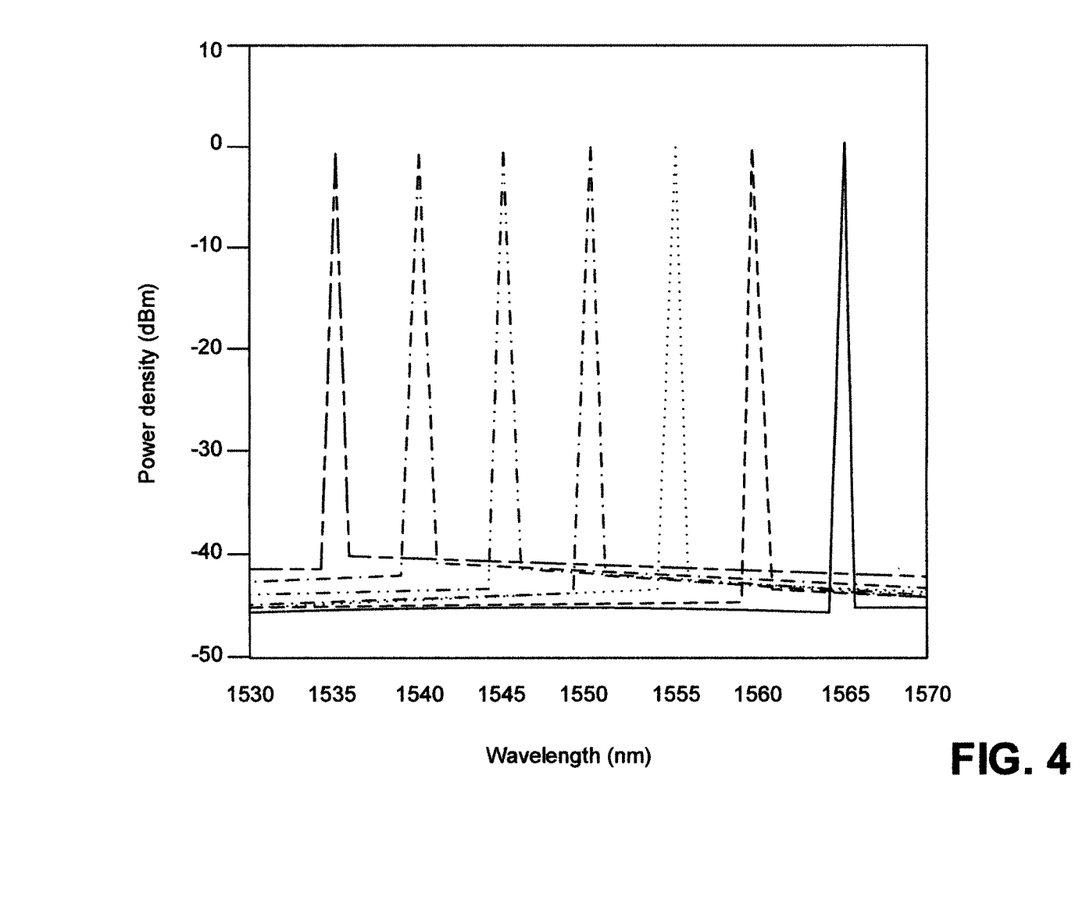
FIG. 4 depicts the wavelength spectrum of the fiber compound-ring laser where $PC_1$, $PC_2$ and $PC_3$, were optimized at each wavelength.

Wavelength Tunability: In one embodiment, the wavelength tuning range of the optical filter was 50 nm. Its maximum IL was 5.5 dB at 1520 nm and its minimum IL was 2.2 dB at 1570 nm. The bias current for both SOAs were set at 200 and 500 mA, for $SOA_1$ and $SOA_2$, respectively. The reflectivity of the $SLM_1$ and $SLM_2$ were set and kept constant at ≤0.1% and ≥99.9%, respectively. In one embodiment, the reflectivity of $SLM_1$ and $SLM_2$ sum to 100%. The reflectivity of each SOA can be independently set between 0 and less than or equal to 99.9%. The wavelength of the output light beam was measured with an OSA, and was tuned by manually adjusting the tunable filter, from 1535 to 1565 nm while optimizing the polarization controllers, $PC_1$, $PC_2$ and $PC_3$, at each wavelength of 1535, 1540, 1545, 1550, 1555, 1560 and 1565 nm, as illustrated in FIG. 4.

Passive Coherent Beam Combining Efficiency: The principle of the passive coherent beam combining technique of two nested ring based fiber lasers with two adjustable output couplers (i.e., Sagnac loop mirrors) is based on passive phase-locking mechanism due to spontaneous self-organization operation. Due to the wide bandwidth of the SOAs, the passive phase-locking mechanism allows the fields' self-adjustment to select common oscillating modes or resonant frequencies of the counter-propagating (i.e., clockwise and counter-clockwise) light beams in the two merged ring cavities and optimize their in-phase locking state conditions without any active phase modulating system.

Figure 5:
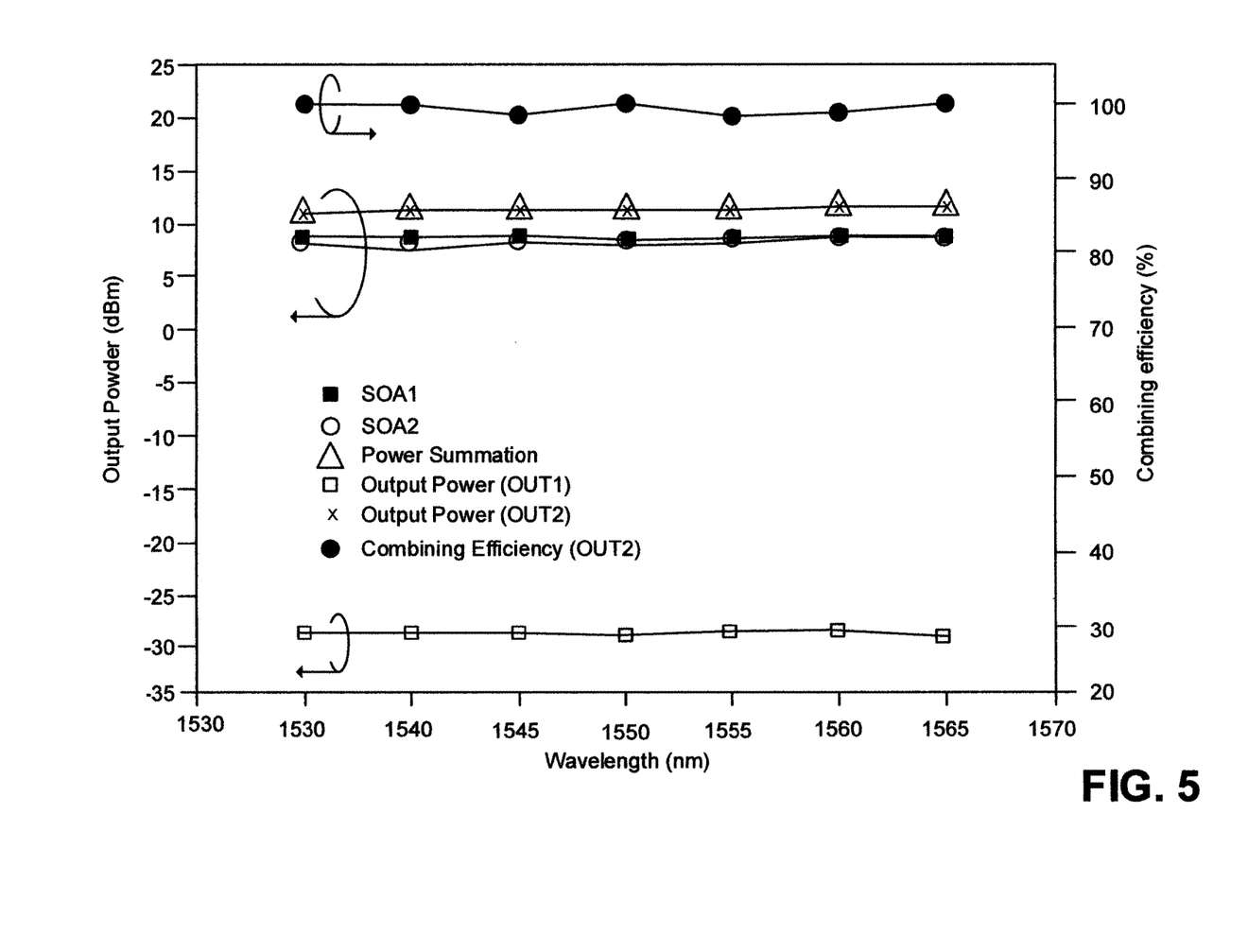
FIG. 5 depicts output power spectrum and optical beam combining efficiency of two SOAs gain media placed in the nested ring fiber cavity.

In order to determine the beam combining efficiency of the fiber laser structure, each individual SOA was used as a gain medium in the common branch I of the compound-ring cavity and measured the output power produced by the fiber laser system at its both output couplers, OUT1 and OUT2. Then, SOAs, $SOA_1$ (Kamelian model) and $SOA_2$ (Thorlabs, S1013S) were placed at the same time in the compound-ring cavities (branch I and II, respectively). The output power delivered at both output couplers of the fiber laser was measured. Note that the reflectivity of the Sagnac loop mirrors, $SLM_1$ and $SLM_2$, was adjusted to maximum (i.e. >99.9%) and minimum (i.e., <0.1%), respectively. The tunable filter was manually adjusted from 1535 to 1565 nm and each semiconductor optical amplifier, $SOA_1$ and $SOA_2$, was driven and kept constant at its standard bias current, 200 and 500 mA, respectively. FIG. 5 illustrates the passive coherent beam combining efficiency spectrum (right vertical axis) and the output power spectrum (left vertical axis) from the fiber compound fiber-ring laser operating with individual SOAs as well as both SOAs over the C-band tuning range of 30 nm.

Referring again to FIG. 5, the beam combining efficiency (filled circles) was obtained by dividing the optical power measured at the output port (OUT2) when the fiber laser was operating with both SOAs by the power summation (unfilled triangles) of the same output port of the fiber laser while operating with individual SOA, $SOA_1$ (filled squares) and $SOA_2$ (unfilled circles). The leakage optical power spectrum (unfilled squares) at the other output port (OUT1) remained below −28.5 dBm. The maximum output power delivered by the fiber laser operating with a single SOA, $SOA_1$ (Kamelian model) and $SOA_2$ (Thorlabs model), was 8.91 and 8.90 dBm at 1565 nm, respectively. On the other hand, when both SOAs were placed in the compound-ring cavities, the maximum measured output power obtained at the output port, OUT2, was 11.9 dBm at 1565 nm, which is almost double of the output power obtained with either individual SOA placed in the fiber compound-ring laser cavity. Moreover, the maximum output power obtained by just adding the optical power from single SOA fiber laser operation at the output port, OUT2, was +11.91 dBm vs. +11.9 dBm measured output power from the fiber laser operating with both SOAs at 1565 nm wavelength. This is where the insertion losses of the tunable filter were the lowest. The maximum and minimum obtained combining efficiency (filled circles) was 99.76% and 98.06% at 1565 nm and 1555 nm, respectively, as shown in FIG. 5 (right vertical axis). Just two SOAs were used in branch I and II due to the limited number of SOAs available during the time of the experiment.

Fiber laser power tunability and its switchable dual-output port operation: The fiber nested ring laser has a feature of operating with two adjustable and switchable output ports (i.e., OUT1 and OUT2). The output power from either output port can be tuned by adjusting the gain of the semiconductor amplifiers, $SOA_1$ and $SOA_2$, (i.e., by controlling their bias current levels) or by adjusting the reflectivity of the Sagnac loop mirrors, $SLM_1$ and $SLM_2$, while keeping the former constant.

The SOA gain adjustment method was performed by setting the tunable filter at 1550 nm wavelength and adjusting the bias current levels, $I_{B1}$ and $I_{B2}$ of both SOAs. Table 1 shows the output power evolution at both output ports, OUT1 and OUT2 as a function of the bias current levels, $I_{B1}$ and $I_{B2}$. The reflectivity of the Sagnac loop mirror, $SLM_1$ and $SLM_2$ were set at ≥99.9% and ≤0.1%, respectively. The achieved maximum dynamic range was 40.75 dB at both SOAs' standard bias current levels of 200 and 500 mA for $SOA_1$ and $SOA_2$, respectively.

TABLE 1

Optical power from the fiber laser output-port, OUT1 AND OUT2, at different bias current $I_B$ (mA) levels and 1550 nm center wavelength.

| $SOA_1$ $I_{B1}$ (mA) | $SOA_2$ $I_{B2}$ (mA) | $P_{OUT1}$ (dBm) | $P_{OUT2}$ (dBm) |
|---|---|---|---|
| 26 | 180 | −36 | −1.5 |
| 50 | 200 | −32 | 5 |
| 75 | 250 | −29.5 | 7.8 |
| 100 | 300 | −28.9 | 9.3 |
| 150 | 400 | −28.6 | 11.1 |
| 200 | 500 | −28.9 | 11.85 |

The second approach involves the adjustment of the reflectivity of both Sagnac loop mirrors, $SLM_1$ and $SLM_2$ while keeping the gain of both SOAs constant (i.e., $I_{B1}$ and $I_{B2}$ set at 200 and 500 mA, respectively). The fiber nested ring laser can be operated in single or dual-output configuration depending on the reflectivity of the $SLM_1$ and $SLM_2$.

In single output configuration, one of the Sagnac loop mirror, $SLM_1$ or $SLM_2$, is kept at high reflectivity (e.g., ≥99.9%) by adjusting its polarization controller, $PC_4$ or $PC_5$, respectively, while keeping the other Sagnac loop mirror at its lowest reflectivity of ≤0.1%. The tunable filter was set at 1550 nm wavelength in order to characterize the power tunability performance of both output ports of the fiber laser. The reflectivity settings of the $SLM_1$ and $SLM_2$ were initialized to ≤0.1% and ≥99.9%, respectively. The initial measured output power from both output ports, OUT1 and OUT2 was +11.85 dBm and −28.9 dBm, respectively. The reflectivity of the Sagnac loop mirror, $SLM_1$, was gradually adjusted by slowly changing the polarization state of the counter-propagating light beam into the $SLM_1$ by adjusting the polarization controller, $PC_4$, while recording the power meter readings and the output signal spectrum at both output ports, OUT1 and the full width at half maximum (FWHM) at output port, OUT1. The output power from the output port, OUT1, was controllable from +11.85 dBm to −28.5 dBm while keeping the other output port, OUT2, at −28.9 dBm by also optimizing the polarization controller, $PC_5$, of $SLM_2$. Similarly, the reflectivity of $SLM_1$ and $SLM_2$ was set to ≥99.9% and ≤0.1%, respectively, and both output ports' performance were checked in the similar manner as stated above, where the measured output power from output port, $OUT_2$ was adjusted from +11.87 dBm to −28.9 dBm while keeping the output port, OUT1, at −28.9 dBm.

Figure 6:
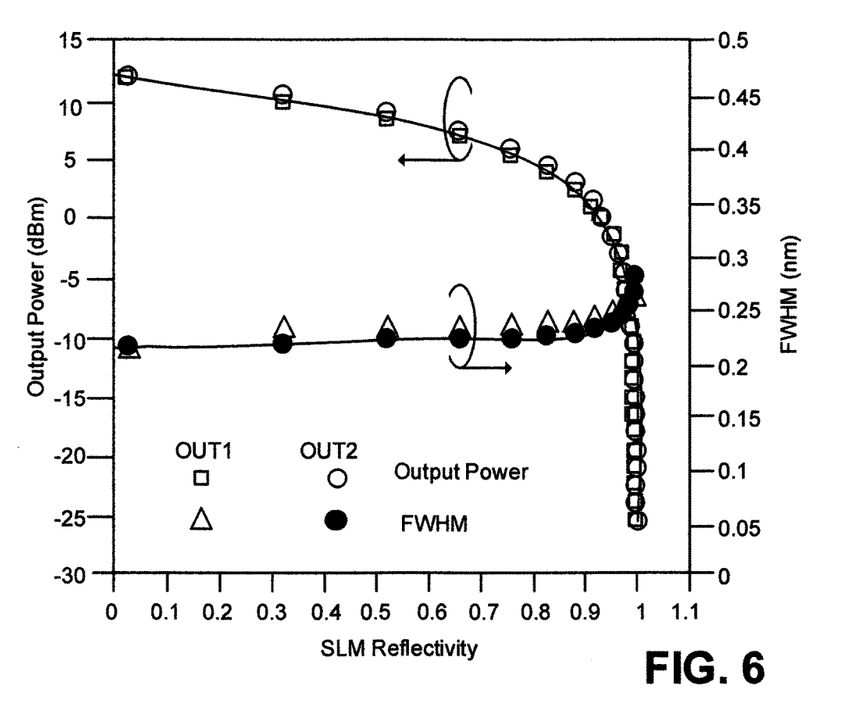
FIG. 6 depicts output power and the 3-dB-bandwidth from both output ports, OUT1 (unfilled squares) and OUT2 (unfilled circles) as a function of different reflectivity values of the Sagnac loop mirrors for single output port operation.

FIG. 6 illustrates the output power from both output ports, OUT1 (unfilled squares) and OUT2 (unfilled circles) as a function of the reflectivity of the $SLM_1$ and $SLM_2$, respectively. Both output port behave similarly and the 3 dB-bandwidth of the light beam from OUT1 (filled triangles) and OUT2 (filled circles) increased as the reflectivity of the Sagnac loop mirrors increased while the output power decreased due to the strong feedback (i.e., reflected light beam) from each SLMs.

Figure 7:
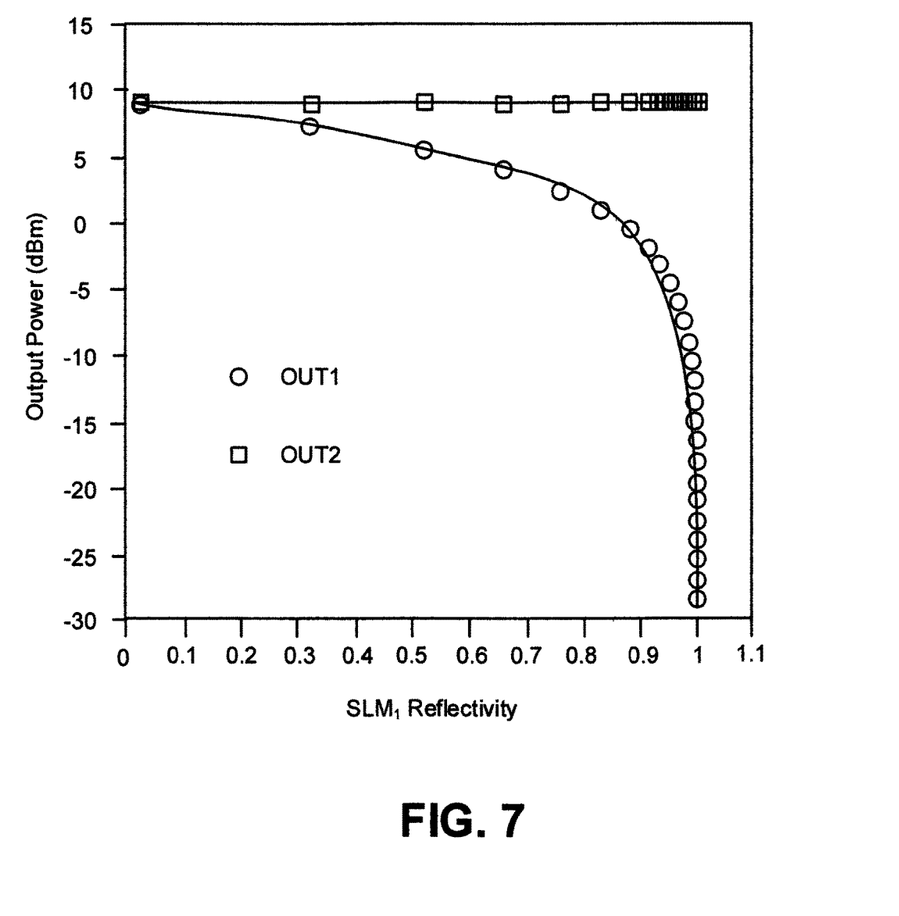
FIG. 7 Illustrates the output power from both output ports, OUT1 (filled circles) and OUT2 (unfilled squares) for different reflectivity values of the Sagnac loop mirror, $SLM_1$ for dual-output port operation while keeping output power at OUT2 constant at +8.95 dBm.

In dual-output port configuration, both output ports can be fixed and also adjusted to any output power between +11.9 and −28.9 dBm. Both output ports, OUT1 and OUT2, were set to +8.94 and +8.95 dBm by adjusting the reflectivity of both Sagnac loop mirrors, $SLM_1$ and $SLM_2$ at ≤0.1%, as shown in FIG. 7. The output power from the output port, OUT1, was gradually tuned from +8.94 to −28.9 dBm by adjusting the reflectivity of the $SLM_1$ from 0.1% to more than 99.9% while optimizing the reflectivity of the $SLM_2$ in order to keep the output power at OUT2 constant at +8.95 dBm. The reflectivity of the $SLM_2$ was around 50% when the one of the $SLM_1$ was around 99.9% in order to maintain the output power at OUT2 constant at +8.95 dBm.

Figure 8:
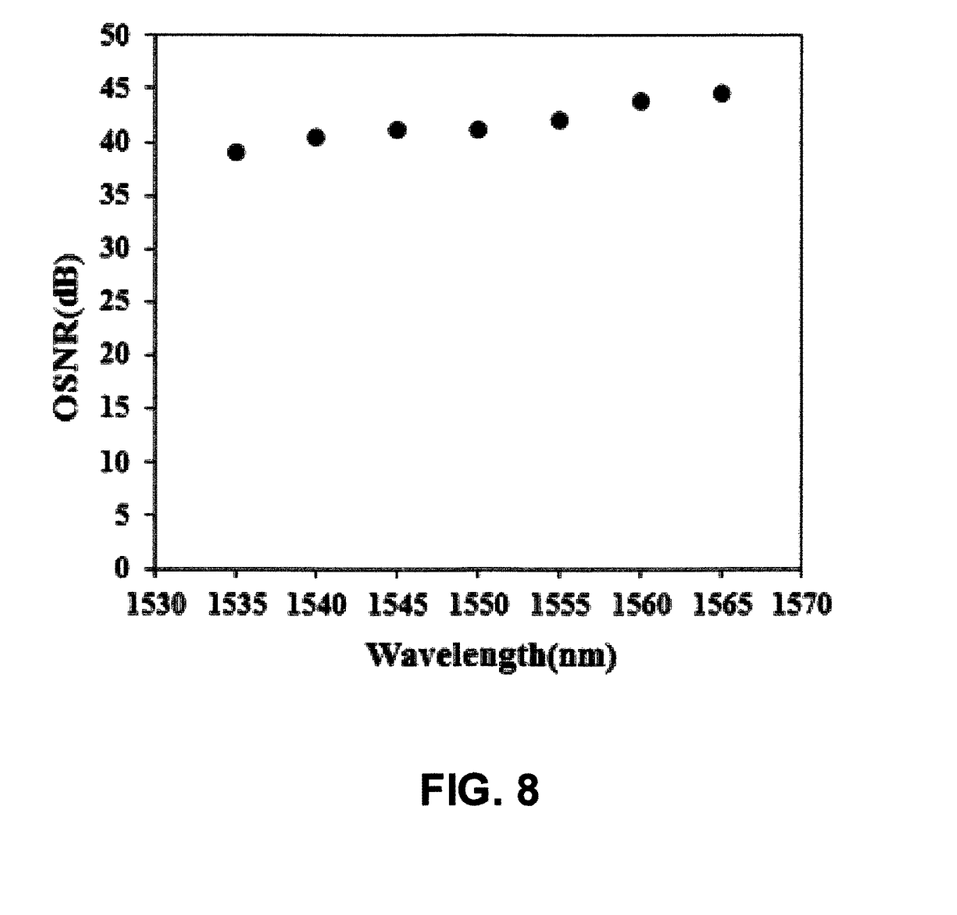
FIG. 8 is a graph showing the OSNR at each center wavelength spectrum, 1535, 1540, 1545, 1550, 1550, 1555, 1560 and 1565 nm with optimized $PC_1$, $PC_2$ and $PC_3$.

Optical Signal-to-Noise Ratio: The measured peak signals from the optical spectrum analyzer for the wavelength spectrum (see FIG. 4) was used to determine the optical signal-to-noise ratio (OSNR) of the fiber compound-ring laser by subtracting the peak power value at each center wavelength (i.e., 1535, 1540, 1545, 1550, 1555, 1560 and 1565 nm) from the background noise level of each wavelength spectrum as demonstrated in FIG. 8. The OSNR remained well above +39 dB over the whole wavelength tuning range, where the maximum OSNR of +44.6 dB was obtained at 1565 nm.

Figure 9:
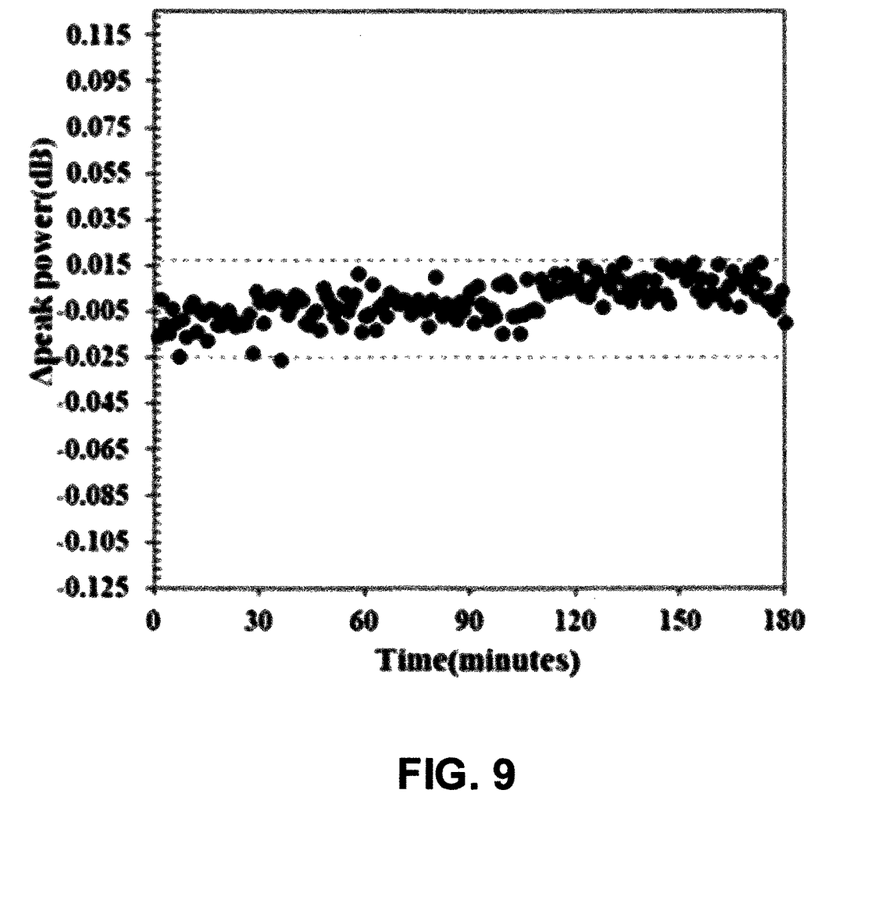
FIG. 9 shows the output power short-term fluctuations of the fiber compound-ring laser at 1550 nm wavelength.

Short-term optical stability: Short-term optical power stability test were performed at room temperature with $SOA_1$, and $SOA_2$ set at the standard bias current levels of 200 and 500 mA, respectively, while the tunable filter was set and kept fixed at 1550 nm central wavelength. The OSA was also used to monitor and acquire the data. The optical stability test was carried out over a course of 180 minutes with time interval of 1 minute, and OSA resolution bandwidth of 0.01 nm without additional data averaging. FIG. 9 shows the power stability measurements with fluctuations of less than ±0.02 dB, which indicates that the fiber compound-ring laser is very stable. The power fluctuations during the stability measurement can be minimized by properly packaging the fiber compound-ring laser system.

Using the disclosed system the expensive high power combiner with a multimode-fiber output port has been eliminated. The disclosed SOA-based fiber nested ring laser structure is a dual-output port all-single-mode-fiber laser structure that can be used in single or dual-output operation with adjustable output power. Using the disclosed system a nested ring cavity configuration, multiple low power SOAs can be stack in the laser cavity and coherently combine them. Thus, one can achieve a high power laser source by using low power optical components.

The disclosed system provides new capabilities such as achieving highly power-scalable, stable, simple, compact and inexpensive high power laser systems using all-single mode fiber based nested ring cavities with C-band SOAs. With the help of advanced in fiber technology, large number of N×N fiber couplers, can be used in the nested ring cavity with variable external reflectors, which is high efficient, stable, highly power-scalable, simple, very compact and inexpensive. Furthermore, with the help of advanced in complementary-metal-oxide-semiconductor (CMOS) technology, this system, can be can be implemented on-chip scale to create a high power laser system.

A simple, stable and inexpensive dual-output port widely tunable SOA-based fiber compound-ring laser structure is demonstrated. This unique nested ring cavity enables the high optical power to split into different branches where amplification and wavelength selection are achieved by using low-power SOAs and a tunable filter. Furthermore, two Sagnac loop mirrors, which are spliced at the two ends of the ring cavity not only serve as variable reflectors but also channel the optical energy back to the same port without using any high optical power combiner. More than 98% coherent beam combining efficiency of two parallel nested fiber ring resonators is achieved over the C-band tuning range of 30 nm. Optical signal to noise ratio (OSNR) of +45 dB, and optical power fluctuation of less than ±0.02 dB are measured over three hours at room temperature.

One novel feature of the system is that it can be switched from low to high power very easily. There are two ways one can control the output power by simply (1) adjusting current setting of the SOA(s) or (2) adjusting polarization controller.

The disclosed design uses a minimum number of components and hence is able to lower the cost significantly. It is based on a TF (tunable filter) and SOA technologies that can be designed to operate at different optical bands, hence tunable fiber lasers covering the S, C or L bands can be implemented. This system does not require any cooling system as is found in most of the high power laser system. In addition, since there are no isolators, circulators, or long fiber lengths in the module and due to the simplicity of the cavity, the disclosed fiber laser can also be implemented in photonic integrated circuit (PIC) platform, leading to compact modules.

The disclosure demonstrates an efficient beam combining scheme based on merging two bidirectional fiber ring cavities to create a simple, compact and inexpensive fiber ring laser structure. The bidirectional operation with variable external Sagnac loop mirrors and the use of semiconductor optical amplifiers as well as passive phase-locking scheme eliminates the use of high power components, such as optical isolators, circulators and power combiners that usually set limits on the output power that the fiber ring laser can deliver. Furthermore, the disclosed structure becomes on-chip scalable scheme due to the fact that the aforementioned optical components are eliminated in the laser cavity.

In contrast, the existing high power fiber laser systems use bulky and expensive optically pumped rare-earth erbium or ytterbium doped fiber amplifiers (EDFAs, YDFAs) and active beam combining techniques to achieve high power laser systems. In contrast, semiconductor optical amplifiers (SOAs) offer several advantages over the EDFAs, such as low price, compactness, lightness, and low power consumption. SOAs have predominantly inhomogeneous broadening properties, which lead to facilitate multiple stable lasing wavelengths at room temperature without mode competition. Furthermore, due to their broad bandwidth, the coherent beam combining is easily achieved by passive phase-locking mechanism due to the spontaneous self-organization operation of the fiber ring lasers where the resonant frequencies of the circulating beams in the two ring resonators self-adjust to optimize the in-phase locking state conditions for the clockwise(cw) and counter-clockwise(ccw) circulating beams.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A fiber laser module comprising:
   a nested-ring resonator that is configured to selectively actuate (1) a first fiber optic branch, (2) a second fiber optic branch or (3) a common fiber optic branch using a first coupler ($C_1$) and a second coupler ($C_2$), wherein
   the first fiber optic branch comprises a first semiconductor optical amplifier ($SOA_1$), a tunable optical filter (TF) and a first polarization controller ($PC_1$);
   the second fiber optic branch comprises a second semiconductor optical amplifier ($SOA_2$) and a second polarization controller ($PC_2$);
   the third fiber optic branch comprises a third semiconductor optical amplifier ($SOA_3$) and a third polarization controller ($PC_3$);
   a first Sagnac loop mirror ($SLM_1$) directly connected to the first coupler ($C_1$), the $SLM_1$ comprising a fourth polarization controller ($PC_4$), a third coupler ($C_3$) and a first output (OUT1); and
   a second Sagnac loop mirror ($SLM_2$) directly connected to the second coupler ($C_2$), the $SLM_2$ comprising a fifth polarization controller ($PC_5$) a fourth coupler ($C_4$) and a second output ($OUT_2$).

2. The fiber laser module as recited in claim 1, further comprising at least one additional fiber optic branch comprising an additional semiconductor optical amplifier ($SOA_N$) and an additional polarization controller ($PC_N$).

3. The fiber laser module as recited in claim 1, further comprising a plurality of additional fiber optic branches, each additional fiber optic branch comprising an additional semiconductor optical amplifier ($SOA_N$) and an additional polarization controller ($PC_N$).

4. The fiber laser module as recited in claim 1, wherein the first semiconductor optical amplifier ($SOA_1$) has a first reflectivity and the second semiconductor optical amplifier ($SOA_2$) has a second reflectivity and the first reflectivity and the second reflectivity sum to 100%.

5. The fiber laser module as recited in claim 4, wherein the first reflectivity is between 0 and 99.9%.

6. The fiber laser module as recited in claim 4, wherein the second reflectivity is between 0 and 99.9%.

7. A fiber laser system comprising a plurality of fiber laser modules as recited in claim 1, wherein each fiber laser module is connected by a power combiner to produce a single output.

8. The fiber laser system as recited in claim 7, wherein the power combination connects to each fiber laser module at a respective second output ($OUT_2$).

9. The fiber laser system as recited in claim 8, wherein each fiber laser module further comprises a polarization controller between the respective second output ($OUT_2$) of each fiber laser module and the power combiner.

10. The fiber laser system as recited in claim 9, wherein each fiber laser module further comprises at least one additional fiber optic branch comprising an additional semiconductor optical amplifier ($SOA_N$) and an additional polarization controller ($PC_N$).

11. The fiber laser system as recited in claim 9, wherein each fiber laser module further comprises a plurality of additional fiber optic branches, each additional fiber optic branch comprising an additional semiconductor optical amplifier ($SOA_N$) and an additional polarization controller ($PC_N$).

* * * * *